United States Patent
Lin (10) Patent No.: US 9,403,672 B2
(45) Date of Patent: Aug. 2, 2016

(54) CHIP PACKAGE AND METHOD OF MANUFACTURING THE SAME

(71) Applicant: XINTEC INC., Taoyuan (TW)

(72) Inventor: Chien-Min Lin, Taoyuan (TW)

(73) Assignee: XINTEC INC., Taoyuan (TW)

( * ) Notice: Subject to any disclaimer, the term of this patent is extended or adjusted under 35 U.S.C. 154(b) by 0 days.

(21) Appl. No.: 14/819,174

(22) Filed: Aug. 5, 2015

(65) Prior Publication Data

US 2016/0039663 A1    Feb. 11, 2016

(30) Foreign Application Priority Data

Aug. 11, 2014    (TW) .............................. 103127489 A (51) Int. Cl.
```
B81B 7/00      (2006.01)
H01L 21/48     (2006.01)
B81C 1/00      (2006.01)
H01L 23/498    (2006.01)
```
(52) U.S. Cl.
CPC .............. *B81B 7/007* (2013.01); *B81C 1/00301* (2013.01); *H01L 21/486* (2013.01); *H01L 21/4853* (2013.01); *H01L 23/49816* (2013.01); *H01L 23/49827* (2013.01); *H01L 23/49838* (2013.01); *B81B 2201/0264* (2013.01); *B81B 2207/096* (2013.01); *B81C 2203/0118* (2013.01)

(58) Field of Classification Search
CPC .............. B81B 7/00; B81B 1/00; B81C 1/00; H01L 21/48; H01L 23/498; H01L 2924/1461; H01L 41/1132; H01L 41/00
See application file for complete search history.

(56) References Cited

U.S. PATENT DOCUMENTS

| | | | | |
|---|---|---|---|---|
| 5,610,431 A | * | 3/1997 | Martin | G01P 1/023 257/415 |
| 6,300,676 B1 | * | 10/2001 | Kawai | B81B 7/007 257/678 |
| 7,696,004 B2 | * | 4/2010 | Yuan | H01L 23/10 257/E21.499 |
| 2005/0167795 A1 | * | 8/2005 | Higashi | B81B 7/007 257/678 |
| 2011/0278734 A1 | * | 11/2011 | Yen | B81B 7/007 257/774 |

* cited by examiner

*Primary Examiner* — Peniel M Gumedzoe
(74) *Attorney, Agent, or Firm* — Liu & Liu (57) ABSTRACT

A method includes forming a bump on a lower surface of an interposer. A first insulation layer is formed to cover the lower surface and bump. A trench is formed extending from the lower towards an upper surface of the interposer. A polymer supporting adhesive layer is formed to surround the bump and couples between the interposer and a semiconductor chip. The semiconductor chip has at least a sensing component and a conductive pad electrically connected to the sensing component, and the bump is connected to the conductive pad. A via is formed extending from the upper towards the lower surface. A second insulation layer is formed to cover the upper surface and the via. A redistribution layer is formed on the second insulation layer and in the via. A packaging layer is formed to cover the redistribution layer and has a second opening.

22 Claims, 8 Drawing Sheets

CHIP PACKAGE AND METHOD OF MANUFACTURING THE SAME

RELATED APPLICATIONS

This application claims priority to Taiwanese Application Serial Number 103127489, filed Aug. 11, 2014, which is herein incorporated by reference.

BACKGROUND

1. Field of Invention

The present invention relates to a package and method of manufacturing the same. More particularly, the present invention relates to a chip package and method of manufacturing the same.

2. Description of Related Art

The reduction in dimension and increase in density of semiconductor components requires even higher packaging skills. The demand of smaller electronic device has increased, and the packaging technique evolves along the course. Three-dimensional semiconductor chip package becomes an effective solution to meet the ever-shrinking dimension.

In a three-dimensional semiconductor chip package, the semiconductor chip is stacked vertically, and the electrical connection is achieved by through package via (TPV). In this way, the length of conductive wires between chips and component size will shrink. Three-dimensional semiconductor chip package technique integrates semiconductor chips with different functions to improve produce efficiency, reduce the package size and reach higher component density. In other words, three-dimensional semiconductor chip package technique can be utilized in even smaller device having higher density, multiple functions, and higher efficiency. In general, three-dimensional semiconductor chip package includes semiconductor chip, interposer having TPV and other substrates. The semiconductor chip is attached to one side of the interposer by soldering to a bump. The bump provides the electrical connection between the integrated circuit chip and the interposer. The other side of the interposer can be electrically connected to a printed circuit board or other integrated circuit chips through soldering balls. By the TPVs, the semiconductor chip and printed circuit board or any other integrated circuit chips on either side of the interposer and can be integrated.

In the integration of the semiconductor chip and the interposer, the soldering bump is typically a specific alloy. The metal phase conversion is achieved by eutectic bonding. Eutectic bonding is a specific diffusion bonding. The alloy can diffuse and mix under a temperature that is lower than any of the solute. Under about 400 to 500 degree Celsius which is relatively low, the metal interface bonding between the integrated circuit chip and the interposer can be established. However, eutectic bonding process has strict requirement on temperature, heating cycles or other parameters in the annealing process such that if the soldering bump is slightly deformed in the process, a mechanical force is generated and greatly affects the interface bonding. Therefore the soldering bump between the semiconductor chip and the interposer is prone to fail in the joining or break apart. There is an urgent call to replace the soldering bump of the semiconductor chip package with new material and process. New materials also brings about issues that is await to be solved.

SUMMARY

The invention provides a chip package and method of manufacturing the same. A polymer supporting adhesive layer replaces the soldering bump in eutectic bonding, such that in the three-dimensional semiconductor chip package, the connection between semiconductor chip and the interposer is achieved by larger interface, therefore ensuring strong bonding. In addition, comparing the polymer supporting adhesive layer and the soldering bump of eutectic bonding, the former one can be done under a lower processing temperature, and therefore the electronic components in the chip package are less likely to be affected by high temperature. Furthermore, polymer supporting adhesive layer has lower production cost and is more suitable in mass production. Still further, the chip package and method of manufacturing the same has specific structure and process order. Breakage is less likely to occur, and the risk of contamination resulting from breakage is reduced.

According to an embodiment of the instant disclosure, the method includes forming at least a bump on a lower surface of an interposer. A first insulation layer is formed to cover the lower surface and the bump. At least a trench is formed extending from the lower surface towards an upper surface of the interposer. A polymer supporting adhesive layer is formed to surround the bump. The polymer supporting adhesive layer couples between the interposer and a semiconductor chip. The semiconductor chip has at least a sensing component and a conductive pad electrically connected to the sensing component, and the bump is connected to the conductive pad. A via is formed extending from the upper surface towards the lower surface. The via goes though the bump to expose the conductive pad, and a width of the via is smaller than that of the bump. A second insulation layer is formed to cover the upper surface and a wall of the via. A redistribution layer is formed on the second insulation layer and in the via to electrically connect to the conductive pad. The interposer is etched to expose the upper surface. Finally, a packaging layer is formed to cover the redistribution layer, and the packaging layer has an opening to expose the trench.

In some embodiments of the instant disclosure, the via is formed by laser drilling.

In some embodiments of the instant disclosure, the width of the via is substantially the same as the width of the bump.

In some embodiments of the instant disclosure, forming the polymer supporting adhesive layer surrounding the bump further includes coating the polymer supporting adhesive layer on the lower surface and photolithography etching the polymer supporting adhesive layer to expose the bump.

In some embodiments of the instant disclosure, in between coupling the interposer and a semiconductor chip by the polymer supporting adhesive layer and forming the via further includes thinning the interposer from the upper surface towards the lower surface.

In some embodiments of the instant disclosure, forming the packaging layer covering the redistribution layer includes coating the packaging layer on the upper surface and the redistribution layer laser drilling the packaging layer to form the opening and expose the trench through the opening.

In some embodiments of the instant disclosure, in coating the packaging layer on the redistribution layer, the packaging layer fills a portion of the via.

In some embodiments of the instant disclosure, the polymer supporting adhesive layer includes a thermal cured material, a UV light cured material or a combination thereof.

In some embodiments of the instant disclosure, the thermal cured material includes epoxy.

In some embodiments of the instant disclosure, the method further includes forming a soldering ball on the interposer, the soldering ball electrically connected to the redistribution layer.

In some embodiments of the instant disclosure, the polymer supporting adhesive layer is a polymer dam.

According to some embodiments of the instant disclosure, a chip package includes a semiconductor chip, an interposer, a polymer supporting adhesive layer, a first insulation layer, a redistribution layer and a packaging layer. The semiconductor chip has at least a sensing unit and at least a conductive pad, and the conductive pad is electrically connected to the sensing unit. The interposer is disposed on the semiconductor and has at least a trench and at least a via. The trench exposes a portion of the sensing unit, and the via exposes the conductive pad. The polymer supporting adhesive layer is sandwiched in between the semiconductor chip and the interposer. The polymer supporting adhesive layer is formed with a first opening connecting to the via to expose the conductive pad. The first insulation layer is disposed on a lower surface of the interposer and a portion of the first insulation layer is disposed in the opening to cover the polymer supporting adhesive layer. The redistribution layer is disposed on the interposer and in the via to electrically connect to the conductive pad. The packaging layer covers the interposer and the redistribution layer, and the packaging layer is formed with a second opening to expose the trench.

In some embodiments of the instant disclosure, the polymer supporting adhesive layer includes a thermal cured material, a UV light cured material or a combination thereof.

In some embodiments of the instant disclosure, the thermal cured material includes epoxy.

In some embodiments of the instant disclosure, the sensing unit is disposed in an active area of the semiconductor chip, the conductive chip is disposed in a peripheral area of the semiconductor chip, and the peripheral area surrounds the active area.

In some embodiments of the instant disclosure, projection of the trench over the semiconductor chip is positioned over at least one side of the active area.

In some embodiments of the instant disclosure, the packaging layer fills a portion of the via.

In some embodiments of the instant disclosure, the chip package further includes a soldering ball disposed on the interposer, and the soldering ball is electrically connected to the redistribution layer.

In some embodiments of the instant disclosure, the chip package further includes a soldering wire electrically connected to the redistribution layer.

In some embodiments of the instant disclosure, the chip package further includes a second insulation layer disposed on an upper surface of the interposer and a wall of the via.

In some embodiments of the instant disclosure, the first insulation layer and the second insulation layer include silicon oxide, silicon nitride, silicon oxynitride or a combination thereof.

In some embodiments of the instant disclosure, the polymer supporting adhesive layer is a polymer dam.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Reference will now be made in detail to the present embodiments of the invention, examples of which are illustrated in the accompanying drawings. Wherever possible, the same reference numbers are used in the drawings and the description to refer to the same or like parts.

Figure 1:
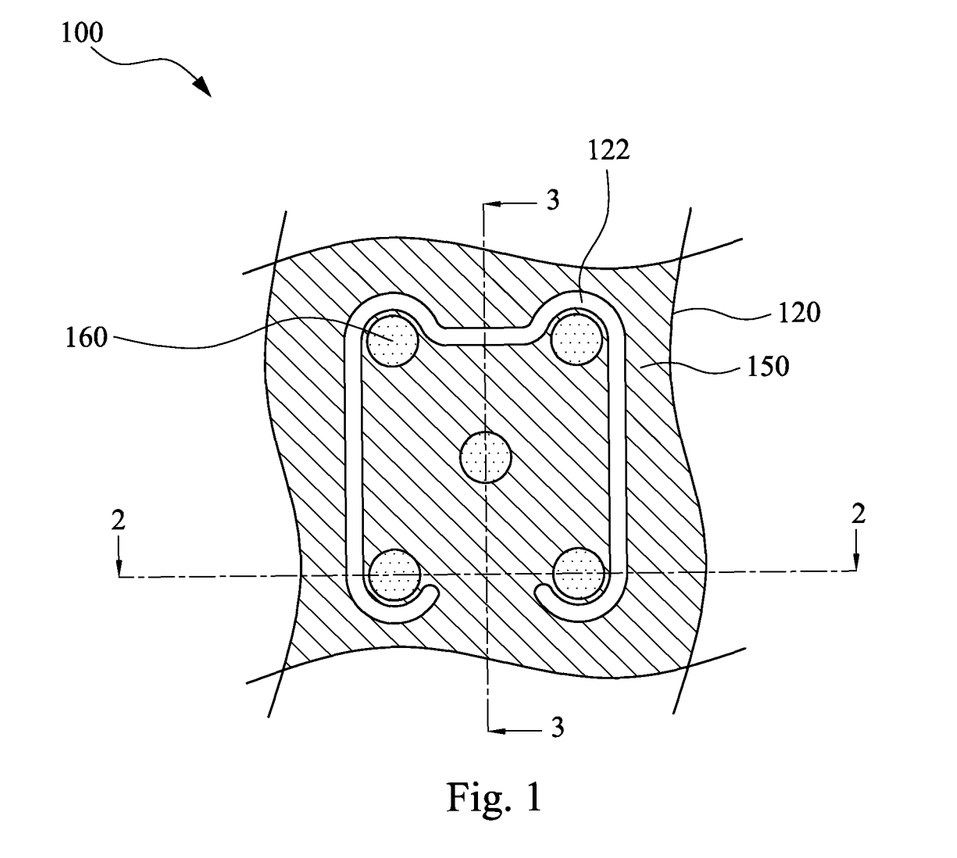
FIG. 1 is a top schematic view of a chip package in accordance with an embodiment of the instant disclosure.
Figure 2:
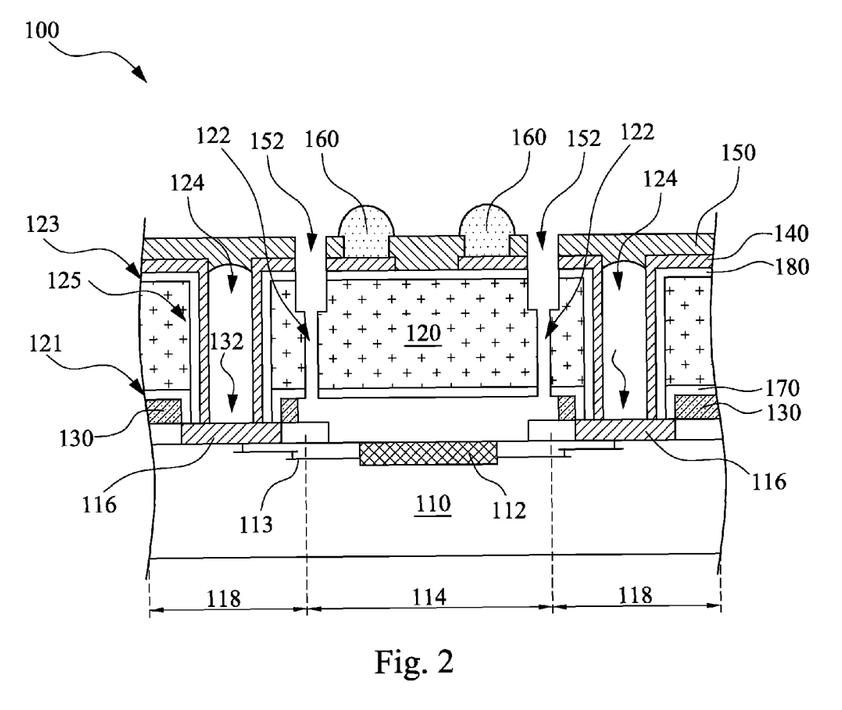
FIG. 2 is a cross-sectional view along line 2 in FIG. 1.
Figure 3:
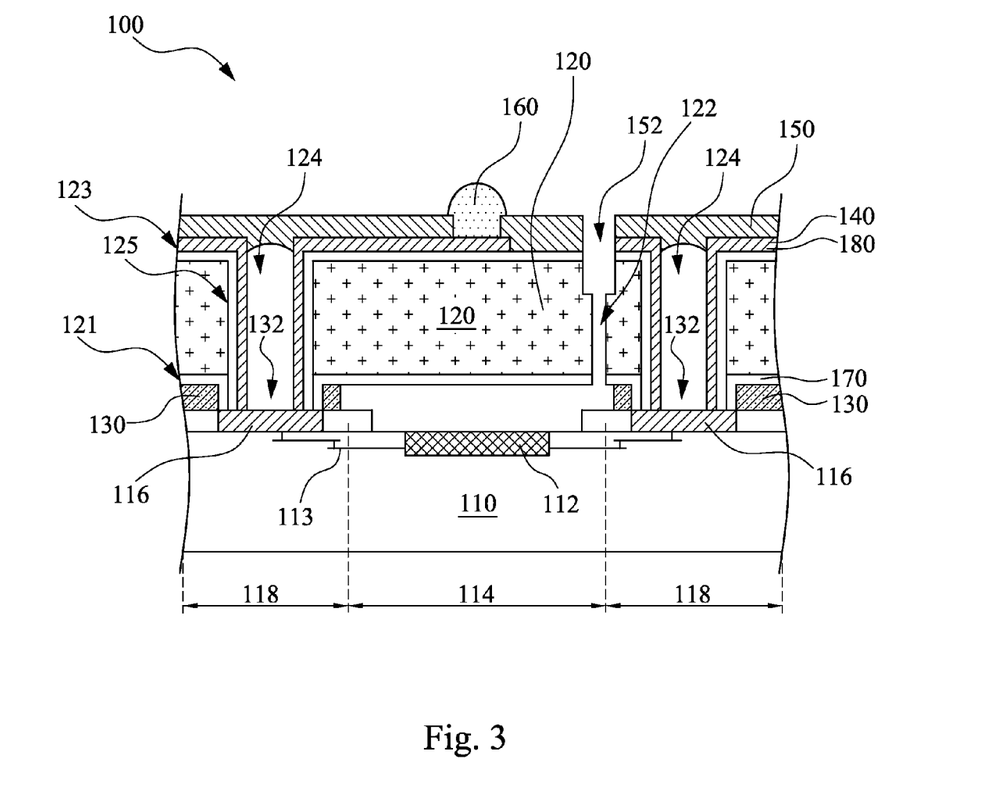
FIG. 3 is a cross-sectional view along line 3 in FIG. 1.

FIG. 1 is a top schematic view of a chip package 100 in accordance with an embodiment of the instant disclosure. FIG. 2 is a cross-sectional view along line 2 in FIG. 1. FIG. 3 is a cross-sectional view along line 3 in FIG. 1. Please refer to FIG. 1 in conjunction with FIGS. 2 and 3. The chip package 100 includes a semiconductor chip 110, an interposer 120, a polymer supporting adhesive layer 130, a redistribution layer 140, a package layer 150, a first insulation layer 170 and a second insulation layer 180. As shown in FIGS. 2 and 3, the semiconductor chip 110 has a sensing unit 112 and a conductive pad 116. In some embodiments of the instant disclosure, the sensing unit 112 is disposed on an active area 114 of the semiconductor chip 110, and the conductive pad 116 is disposed on a peripheral area 118 of the semiconductor chip 110. The peripheral area 118 surrounds the active area 114. The conductive pad 116 is electrically connected to the sensing unit 112. The semiconductor chip 110 may be made of, for example, silicon, germanium or group III-V elements. The sensing unit 112 may be but not limited to, for example, surface audio wave unit, pressure sensor, physical sensor using heat, pressure or other physical variant to detect, micro electro mechanical systems (MEMS), active element, passive element, electronic components of digital or analogue circuit, micro fluidic systems, radio frequency circuits, accelerator, gyroscope, micro actuator or the like. As shown in FIGS. 2 and 3, the conductive pad 116 may be, for example, disposed on either side of the sensing unit 112 and electrically connected to the sensing unit 112. The electrical connection can be established by, for example, an inner wire connection structure 113 such that the conductive pad 116 in the peripheral area 118 of the semiconductor chip 110 can be electrically connected to the sensing unit 112 in the active area 114 of the semiconductor chip 110. The conductive pad 116 may be the signal controlling input/output end of the sensing unit 112, and the sensing unit 112 of the semiconductor chip 110 may undergo signal regulation. The material of the conductive pad 116 may be, for example, aluminium, copper, nickel or other suitable materials.

Please refer to FIGS. 2 and 3. The interposer 120 is disposed on the semiconductor chip 110. The interposer 120 is formed with a trench 122 and a via 124. The trench 122 exposes a portion of the sensing unit 112. The via 124 exposes the conductive pad 116. The interposer 120 may be silicon. The trench 122 goes through the interposer 120, such that the sensing unit 112 of the semiconductor chip 110 underlying the interposer 120 may be exposed. In this configuration, external audio wave, pressure, temperature or any other changes can be detected, and sensing signals will be generated. In some embodiments of the instant disclosure, a projection of the trench 122 is positioned on at least one side of the active area 114 of the semiconductor chip 110. As shown in FIG. 1 in conjunction with FIGS. 2 and 3, the trench 122 projection surrounds three sides of the active area 114, and one side is left for connection. However, the instant disclosure is not limited thereto. The position and configuration of the trench 122 may vary according to different requirement, and the trench 122 may be a continuous trench or a number of smaller trenches in a collection.

Please refer to FIGS. 2 and 3. The polymer supporting adhesive layer 130 is sandwiched between the semiconductor chip 110 and the interposer 120. The polymer supporting adhesive layer 130 is attached to both the semiconductor chip 110 and the interposer 120 so as to join the two. The polymer supporting adhesive layer 130 may be any polymer suitable for chip attachment. In some other embodiments, the polymer supporting adhesive layer 130 includes thermal curing material, UV curing material or a combination thereof. In some embodiments of the instant disclosure, the polymer supporting adhesive layer 130 includes epoxy. It should be noted that polymer supporting adhesive layer 130 is different from the conventional soldering bump for joining the semiconductor chip and the interposer. The soldering bumps are usually a specific alloy undergoing metal phase conversion by eutectic bonding, such that the alloy diffuses and mixes when under a melting point of one of the ingredients. Therefore, the metallic interface bonding between the integrated circuit chip and the interposer can be formed under relatively lower temperature, for example, 400 to 500 degree Celsius. The polymer supporting adhesive layer 130 does not require the high temperature to achieve polymer curing attachment. In general, polymer curing attachment can be achieved under 300 degree Celsius. By appropriate ingredient selection and formula, the polymer supporting adhesive layer 130 can be formed and joins the semiconductor chip 110 and the interposer 120 under 200 degree Celsius. As a result, the combination of semiconductor chip 110 and the interposer 120 can be carried out under even lower thermal budget, so as to reduce the heat effect on the electronic components in the chip package. In addition, eutectic bonding process has strict requirement on temperature, heating cycles or other parameters in the annealing process such that if the soldering bump is slightly deformed in the process, a mechanical force is generated and greatly affects the interface bonding. Therefore the soldering bump between the semiconductor chip and the interposer is prone to fail in the joining or break apart. In comparison, the polymer supporting adhesive layer 130 can be easily controlled in the curing process. The ability of attachment of polymer supporting adhesive layer 130 is unlikely to be affected by process variation. The polymer supporting adhesive layer 130 replaces the soldering bumps that undergoes eutectic bonding, and therefore the contact area between the semiconductor chip 110 and the interposer 120 may have larger process margin. In this regard, the connection between the semiconductor chip 110 and the interposer 120 is firmly secured. Furthermore, the polymer supporting adhesive layer 130 has lower production cost and is therefore more suitable for mass production. As shown in FIGS. 2 and 3, the polymer supporting adhesive layer 130 is formed with a first opening 132 that connects to the via 124 to expose the conductive pad 116. The first opening 132 may be formed by photolithography or laser drilling. The conductive path between the semiconductor chip 110 and the interposer 120 can go through this path, and the conductive pad 116 of the semiconductor chip 110 and the redistribution layer 140 on a wall 125 of the via 124 are therefore electrically connected. In some embodiments of the instant disclosure, the polymer supporting adhesive layer 130 is a polymer dam.

Please refer to FIGS. 2 and 3. The first insulation layer 170 is disposed on a lower surface 121 of the interposer. The material of the first insulation layer 170 may be silicon oxide, silicon nitride, silicon oxynitride or any other suitable insulating material. The first insulation layer 170 may be formed by chemical vapor deposition over the lower surface 121 of the first insulation layer 170 so as to ensure the electrical insulation between the redistribution layer 140 and the interposer 120. It should be noted that a portion of the first insulation layer 170 is disposed over the first opening 132 and covers the polymer supporting adhesive layer 130. In other words, the polymer supporting adhesive layer 130 does not directly contact the redistribution layer 140 which is formed in the subsequent process. The first insulation layer 170 separates the polymer supporting adhesive layer 130 and the redistribution layer 140. Therefore, the redistribution layer 140 which is formed in a later stage will not be affected by the polymer supporting adhesive layer 130 that exhibits attachment property and has higher thermal expansion coefficient. Consequently, the redistribution layer 140 is less likely to break, and the yielding rate of the chip package 100 can effectively increase. As shown in FIGS. 2 and 3, in some embodiments of the instant disclosure, the chip package 100 further includes a second insulation layer 180 disposed on an upper surface 123 of the interposer 120 and on a wall 125 of the via 124. The material of the second insulation layer 180 may be silicon oxide, silicon nitride, silicon oxynitride or any other suitable materials. The second insulation layer 180 is formed by chemical vapour deposition conforming to the upper surface 123 of the interposer 120 and the wall 125 of the via 124. The second insulation layer 180 may further separate the polymer supporting adhesive layer 130 and the redistribution layer 140 formed in the following step in order to avoid any adverse effects caused by the polymer supporting adhesive layer 130 to the redistribution layer 140. In other words, the later-formed redistribution layer will not be directly affected by the polymer supporting adhesive layer 130 that has a higher thermal expansion coefficient. Therefore, wire breakage in the later-formed redistribution layer 140 can be further reduced. The yielding rate of the chip package 100 is concurrently increased.

Please refer to FIGS. 2 and 3. The redistribution layer 140 is disposed on the interposer 120 and inside the via 124 to electrically connect the conductive pad 116. The material of the redistribution layer 140 may be, for example, aluminium, copper or nickel or any other suitable materials and is disposed on the second insulation layer 180 by suitable deposition process. The redistribution layer 140 undergoes photolithography to create a predetermined pattern over the second insulation layer 180. The packaging layer 150 covers the interposer 120 and the redistribution layer 140. The packaging layer 150 is formed with a second opening 152 to expose the trench 122. The material of the packaging layer 150 may be solder mask or any other suitable material for packaging. The solder mask is spread on the upper surface 123 of the interposer 120. As shown in FIGS. 2 and 3, in some embodiments of the instant disclosure, the packaging layer 150 fills a portion of the via 124. As a result, the contact area between the packaging layer 150 and the redistribution layer 140 over the wall 125 of the via 124 is relatively smaller, and a pressure between the packaging layer 150 and the redistribution layer 140 over the wall 125 of the via 124 can be reduced. The expansion or creases of the packaging layer 150 will have less effect to the redistribution layer 140, and wire breakage in redistribution layer 140 is less likely to occur. The overall durability of the chip package 100 is therefore greatly enhanced.

As shown in FIGS. 2 and 3, in some embodiments of the instant disclosure, the chip package 100 further includes a soldering ball 160 disposed on the interposer 120. The soldering ball 160 is electrically connected to the redistribution layer 140. The material of the soldering ball 160 may be tin or any other suitable metal or metal alloy for soldering. The soldering ball 160 acts as a bridge between the chip package 100 and the external printed circuit board or other interposers. The signal generated by the sensing unit 112 from a detection event can control the input/output signal of the printed circuit board or other interposers through the soldering ball 160, redistribution layer 140 and the conductive pad 116 that is electrically connected to the sensing unit 112. The input/output signal from the printed circuit board or the other interposers can control the sensing unit 112 through the soldering ball 160, redistribution layer 140 and the conductive pad 116 that is electrically connected to the sensing unit 112. In some embodiments of the instant disclosure, the chip package 100 may further include soldering wire (not shown) electrically connected to the redistribution layer 140. The soldering wire can act as a bridge between the chip package 100 to external printed circuit board or other interposers. The method of fabricating the chip package 100 is elaborated hereafter.

Figure 4:
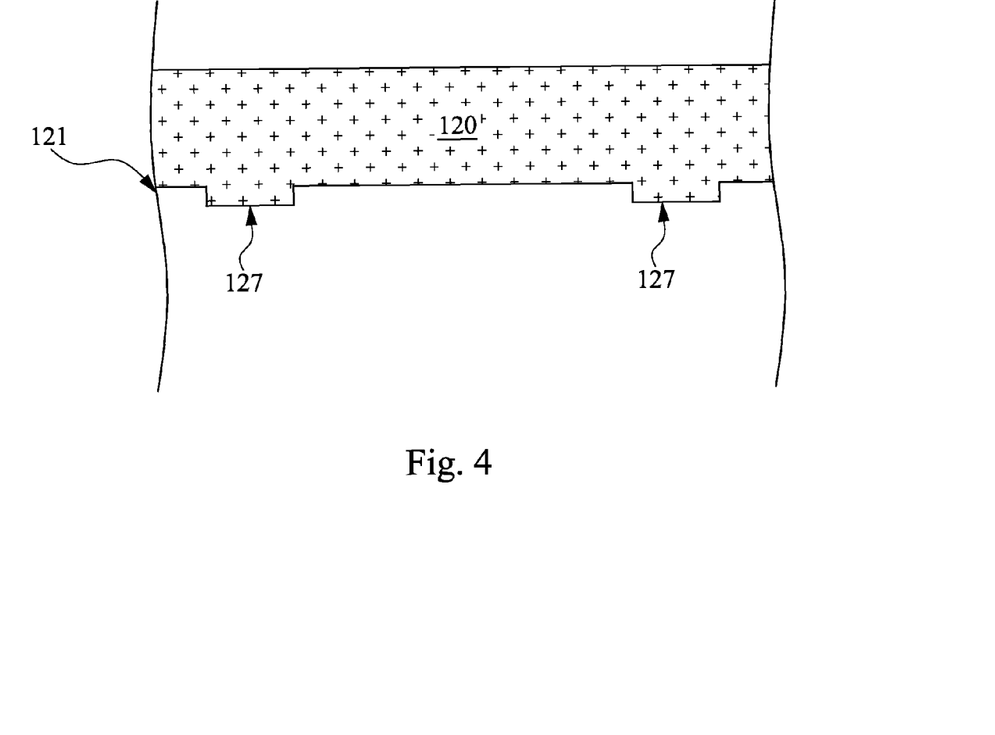
FIG. 4 is a cross-sectional view of a step in a process of fabricating a chip package in accordance with an embodiment of the instant disclosure.

FIG. 4 is a cross-sectional view of a step in a process of fabricating a chip package in accordance with an embodiment of the instant disclosure. Firstly, a bump 127 is formed on the lower surface 121 of the interposer 120. The interposer 120 may include silicon. The bump 127 may be formed by photolithography from the lower surface 121 toward the upper surface 123 of the interposer 120. The bump 127 is formed on a predetermined position having specific dimension. The bump 127 on the lower surface 121 of the interposer 120 can be used to attach the conductive pad 116 of the semiconductor 110, and then the bump 127 is emptied out to be the via 124. Therefore, the position and dimension of the bump 127 may vary according to practical needs.

Figure 5:
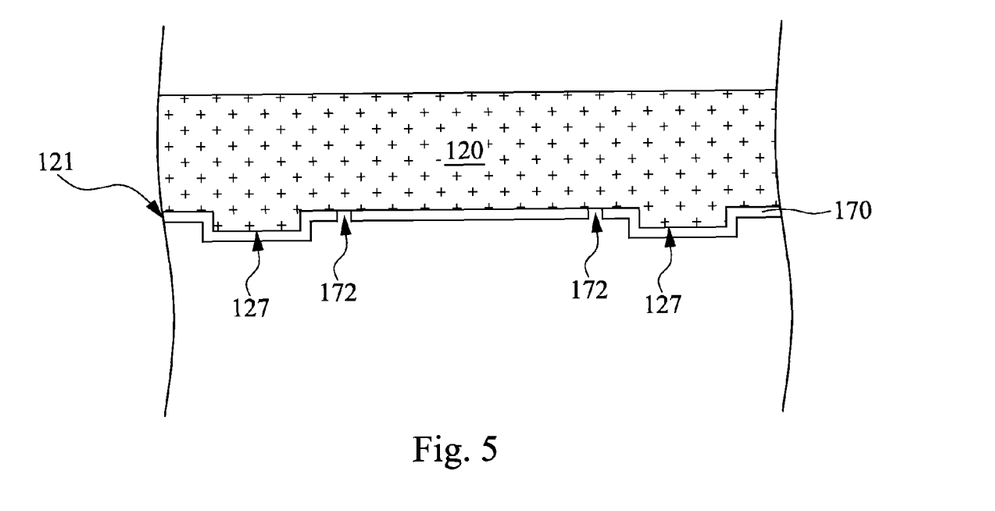
FIG. 5 is a cross-sectional view of a step after FIG. 4 in a process of fabricating a chip package in accordance with an embodiment of the instant disclosure.
Figure 6:
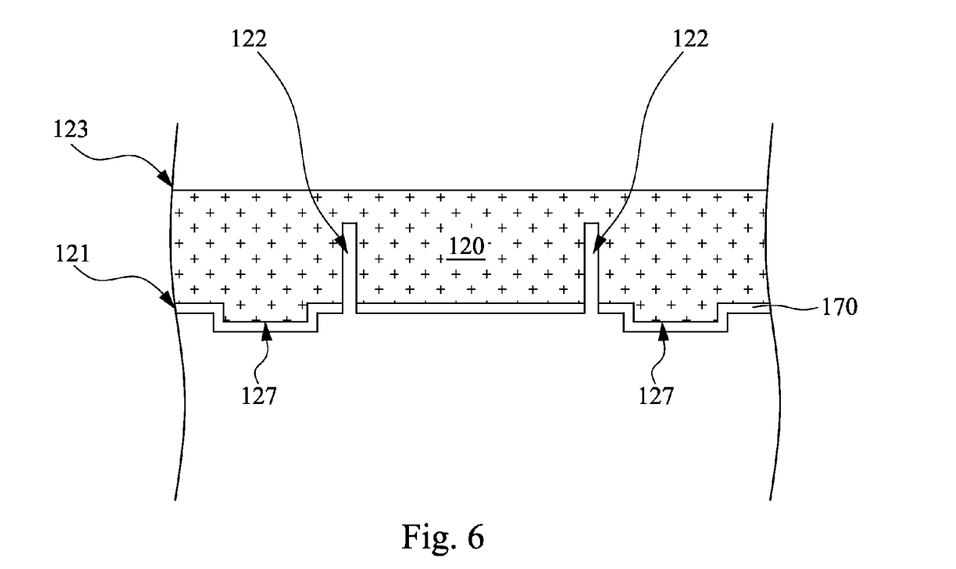
FIG. 6 is a cross-sectional view of a step after FIG. 5 in a process of fabricating a chip package in accordance with an embodiment of the instant disclosure.

FIG. 5 is a cross-sectional view of a step after FIG. 4 in the process of fabricating the chip package in accordance with an embodiment of the instant disclosure. FIG. 6 is a cross-sectional view of a step after FIG. 5 in the process of fabricating the chip package in accordance with an embodiment of the instant disclosure. Please refer to FIG. 5. The first insulation layer 170 is formed on the lower surface 121 of the interposer 120. The material of the first insulation layer 170 may be silicon oxide, silicon nitride, silicon oxynitride or any other suitable insulation material. The first insulation layer 170 is formed by chemical vapour deposition conforming to the lower surface 121 of the interposer 120 to form a thin insulation film. Next, photolithography is carried out to define the position of the trench 122 of the interposer 120. The opening 172 is then formed as shown in FIG. 5. Please refer to FIG. 6. After the formation of the insulation layer 170 on the lower surface 121 of the interposer 120, a trench 122 is formed and extending from the lower surface 121 toward the upper surface 123 of the interposer 120. The trench 122 is used as a path connecting the upper and lower portions of the interposer 120, such that the sensing unit 112 of the semiconductor 110 can be exposed from the trench. The audio wave, pressure, temperature or other changes from the exterior can then be detected, and associated signals are generated.

Figure 7:
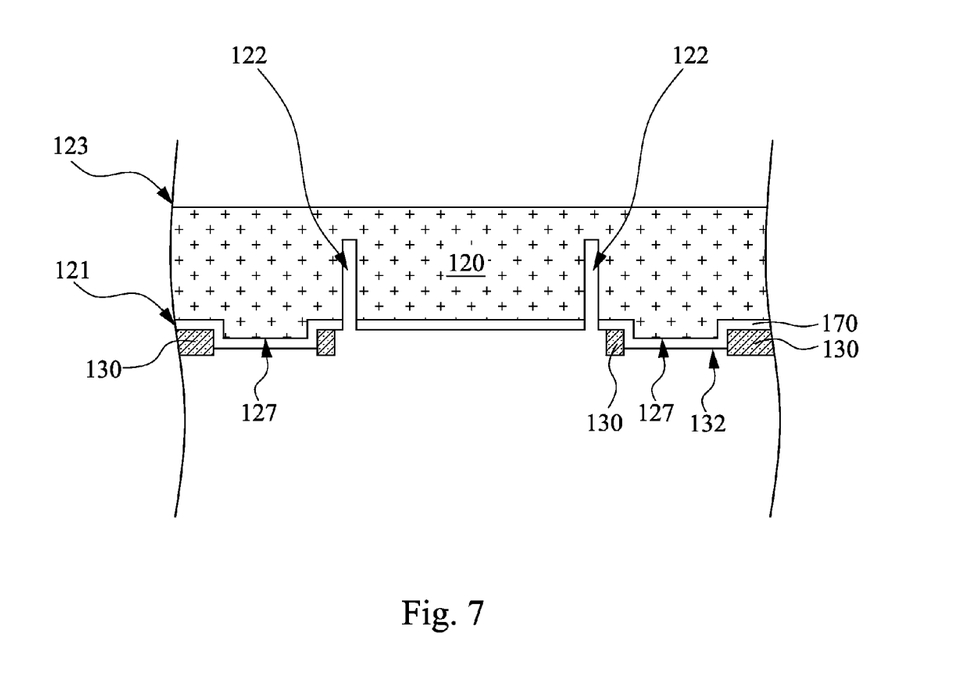
FIG. 7 is a cross-sectional view of a step after FIG. 6 in a process of fabricating a chip package in accordance with an embodiment of the instant disclosure.

FIG. 7 is a cross-sectional view of a step after FIG. 6 in the process of fabricating the chip package in accordance with an embodiment of the instant disclosure. As shown in FIG. 7, after the formation of the trench 122 extending from the lower surface 121 toward the upper surface 123 of the interposer 120, the polymer supporting adhesive layer 130 is formed and surrounds the bump 127. The polymer supporting adhesive layer 130 is formed with the first opening 132 to expose the bump 127, such that the bump 127 can connect to the conductive pad 116 of the semiconductor chip 110. The polymer supporting adhesive layer 130 may be any polymer suitable for chip attachment. In some other embodiments, the polymer supporting adhesive layer 130 includes thermal curing material, UV curing material or a combination thereof. In some embodiments of the instant disclosure, the polymer supporting adhesive layer 130 includes epoxy. It should be noted that polymer supporting adhesive layer 130 is different from the conventional soldering bump for joining the semiconductor chip and the interposer. The soldering bumps are usually a specific alloy undergoing metal phase conversion by eutectic bonding, such that the alloy diffuses and mixes when under a melting point of one of the ingredients. Therefore, the metallic interface bonding between the integrated circuit chip and the interposer can be formed under relatively lower temperature, for example, 400 to 500 degree Celsius. The polymer supporting adhesive layer 130 does not require the high temperature to achieve polymer curing attachment. In general, polymer curing attachment can be achieved under 300 degree Celsius. In addition, eutectic bonding process has strict requirement on temperature, heating cycles or other parameters in the annealing process such that if the soldering bump is slightly deformed in the process, a mechanical force is generated and greatly affects the interface bonding. Therefore the soldering bump between the semiconductor chip and the interposer is prone to fail in the joining or break apart. In comparison, the polymer supporting adhesive layer 130 can be easily controlled in the curing process. The ability of attachment of polymer supporting adhesive layer 130 is unlikely to be affected by process variation. The polymer supporting adhesive layer 130 replaces the soldering bumps that undergoes eutectic bonding, and therefore the contact area between the semiconductor chip 110 and the interposer 120 may have larger process margin. In this regard, the connection between the semiconductor chip 110 and the interposer 120 is firmly secured. Furthermore, the polymer supporting adhesive layer 130 has lower production cost and is therefore more suitable for mass production. In some embodiments of the instant disclosure, in the step of forming the polymer supporting adhesive layer 130 over the lower surface 121 further includes spreading the polymer supporting adhesive layer 130 on the lower surface 121 and treats the polymer supporting adhesive layer 130 by photolithography such that the bump 127 is exposed. It should be noted that before connecting semiconductor chip 110, polymer supporting adhesive layer 130 should under go photolithography to form the first opening 132. In other words, the first opening 132 of the polymer supporting adhesive layer 130 should be formed before the semiconductor chip 110 is attached. When the semiconductor chip 110 is attached, the first opening 132 of the polymer supporting adhesive layer 130 allows contact between the conductive pad 116 and the semiconductor chip 110. The polymer supporting adhesive layer 130 does not contact the conductive pad 116 of the semiconductor chip 110 directly. That is to say, the polymer supporting adhesive layer 130 does not need to go through opening formation process to expose the conductive pad 116. In this way, it can effectively reduce the chance of the conductive pad 116 being damaged in the opening formation process (e.g., photolithography) of the polymer supporting adhesive layer 130. The reliability of the chip package 100 is further enhanced. In some embodiments of the instant disclosure, the polymer supporting adhesive layer 130 includes thermal curing material, UV curing material or a combination thereof. In some embodiments of the instant disclosure, the polymer supporting adhesive layer 130 includes epoxy. By appropriate ingredient selection and formula, the polymer supporting adhesive layer 130 can be formed and joins the semiconductor chip 110 and the interposer 120 under 200 degree Celsius. As a result, the combination of semiconductor chip 110 and the interposer 120 can be carried out under even lower thermal budget, so as to reduce the heat effect on the electronic components in the chip package. In some embodiments of the instant disclosure, the polymer supporting adhesive layer 130 is a polymer dam.

Figure 8:
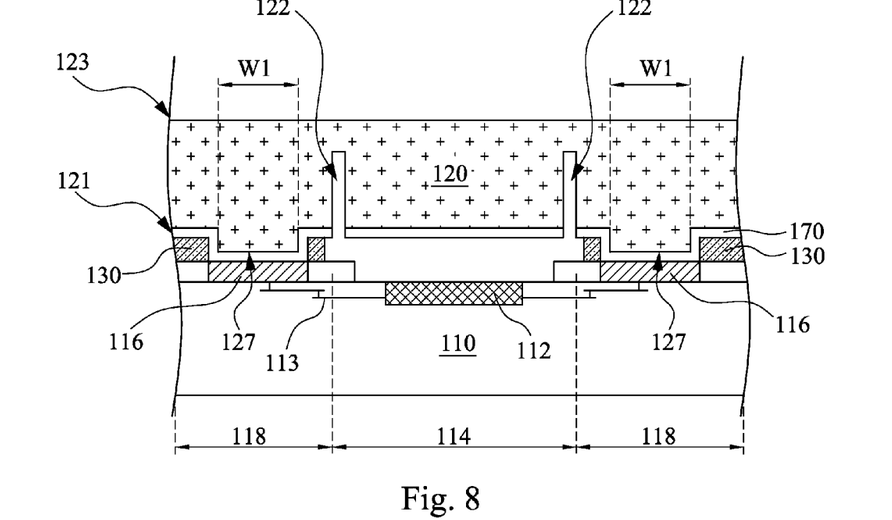
FIG. 8 is a cross-sectional view of a step after FIG. 7 in a process of fabricating a chip package in accordance with an embodiment of the instant disclosure.
Figure 9:
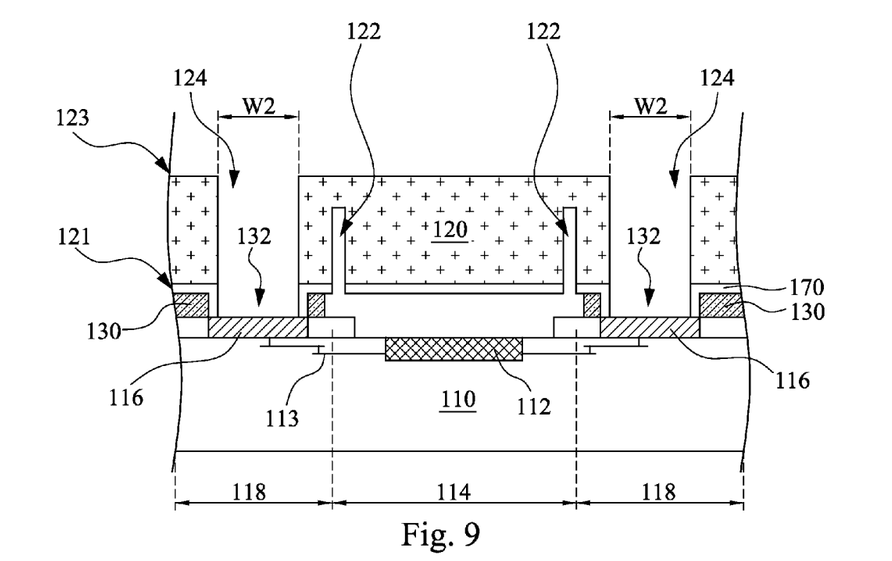
FIG. 9 is a cross-sectional view of a step after FIG. 8 in a process of fabricating a chip package in accordance with an embodiment of the instant disclosure.

FIG. 8 is a cross-sectional view of a step after FIG. 7 in the process of fabricating the chip package in accordance with an embodiment of the instant disclosure. FIG. 9 is a cross-sectional view of a step after FIG. 8 in the process of fabricating the chip package in accordance with an embodiment of the instant disclosure. Please refer to FIG. 8. after the formation of the polymer supporting adhesive layer 130 surrounding the bump 127. The interposer 120 and the semiconductor chip 110 are connected through the polymer supporting adhesive layer 130. The semiconductor chip 110 has the sensing unit 112 and the conductive pad that is electrically connected to the sensing unit 112. The first opening 132 of the polymer supporting adhesive layer 130 corresponds to the conductive pad 116. The material of and relationship between the semiconductor chip 110, sensing unit 112 and the conductive pad 116 are as previously described. Please refer to FIG. 9. After the interposer 120 and the semiconductor chip 110 are connected through the polymer supporting adhesive layer 130, the via 124 is formed and extending from the lower surface 121 towards the upper surface 123. The via 124 goes through the bump 127 and expose the conductive pad 116. The via 124 may be, for example, through silicon via (TSV). The via 124 may be formed by dry etching or other suitable via forming process. In some embodiments of the instant disclosure, the via 124 is formed by laser drilling. Laser drilling is used in place of dry etching so as to avoid contamination in the rinsing process after dry etching. The yield rate and durability of the chip package 100 are both increased. It should be noted that, as shown in FIGS. 8 and 9, a width W2 of the via 124 is smaller than a width W1 of the bump 127. That is to say, the coverage of via 124 of the interposer 120 which is formed by etching or laser drilling does not exceed the bump 127. Therefore, the formation of the via 124 does not expose the polymer supporting adhesive layer 130. As a result, when forming the redistribution layer 140 in the via 124, the polymer supporting adhesive layer 130 does not contact the redistribution layer 140. This arrangement can effectively avoid any adverse effect to the redistribution layer 140, for example, wire breakage, caused by the polymer supporting adhesive layer 130. The width W2 of the via 124 and the width W1 of the bump 127 may vary according to practical requirement. In some embodiments of the instant disclosure, in the step of forming the via 124, the width W2 of the via (as shown in FIG. 9) is substantially the same as the width W1 of the bump 127 (as shown in FIG. 8). As shown in FIG. 9, a portion of the first insulation layer 170 is disposed over the first opening 132 and covers the polymer supporting adhesive layer 130. In other words, the polymer supporting adhesive layer 130 does not directly contact the redistribution layer 140 which is formed in the subsequent process. The first insulation layer 170 separates the polymer supporting adhesive layer 130 and the redistribution layer 140. Therefore, the redistribution layer 140 which is formed in a later stage will not be affected by the polymer supporting adhesive layer 130 that exhibits attachment property and has higher thermal expansion coefficient. Consequently, the redistribution layer 140 is less likely to break, and the yielding rate of the chip package 100 can effectively increase.

Please refer to FIG. 9. the via goes through the upper surface 123 to the lower surface 121 of the interposer 120 so as to expose the conductive pad 116, such that a conductive path for the conductive pad 116 can be formed in the via 124 in the next stage. In some embodiments of the instant disclosure, in the step of connecting the interposer 120 and the semiconductor chip 110 through the via 124 further includes thinning the interposer 120 from the upper surface 123 towards the lower surface 121. For example, the interposer 120 may be thinned from 700 micrometer to 200 micrometer. The formation of the via 124 can be more efficient and the final product of the chip package 100 will have a thinner overall thickness.

Figure 10:
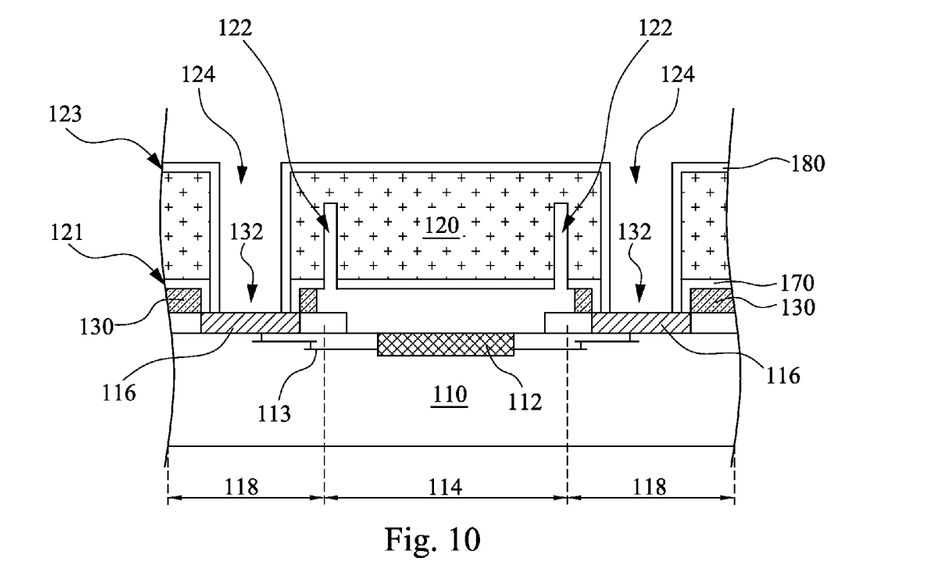
FIG. 10 is a cross-sectional view of a step after FIG. 9 in a process of fabricating a chip package in accordance with an embodiment of the instant disclosure.

FIG. 10 is a cross-sectional view of a step after FIG. 9 in the process of fabricating the chip package in accordance with an embodiment of the instant disclosure. After the formation of the via 124 from the upper surface 123 towards the lower surface 121, the second insulation is formed to cover the upper surface 123 and the wall 125 of the via 124. The material of the second insulation layer 180 may be silicon oxide, silicon nitride, silicon oxynitride or any other suitable materials. The second insulation layer 180 is formed by chemical vapour deposition conforming to the upper surface 123 of the interposer 120 and the wall 125 of the via 124. The second insulation layer 180 may further separate the polymer supporting adhesive layer 130 and the redistribution layer 140 formed in the following step in order to avoid any adverse effects caused by the polymer supporting adhesive layer 130 to the redistribution layer 140. In other words, the later-formed redistribution layer will not be directly affected by the polymer supporting adhesive layer 130 that has a higher thermal expansion coefficient. Therefore, wire breakage in the later-formed redistribution layer 140 can be further reduced. The yielding rate of the chip package 100 is concurrently increased.

Figure 11:
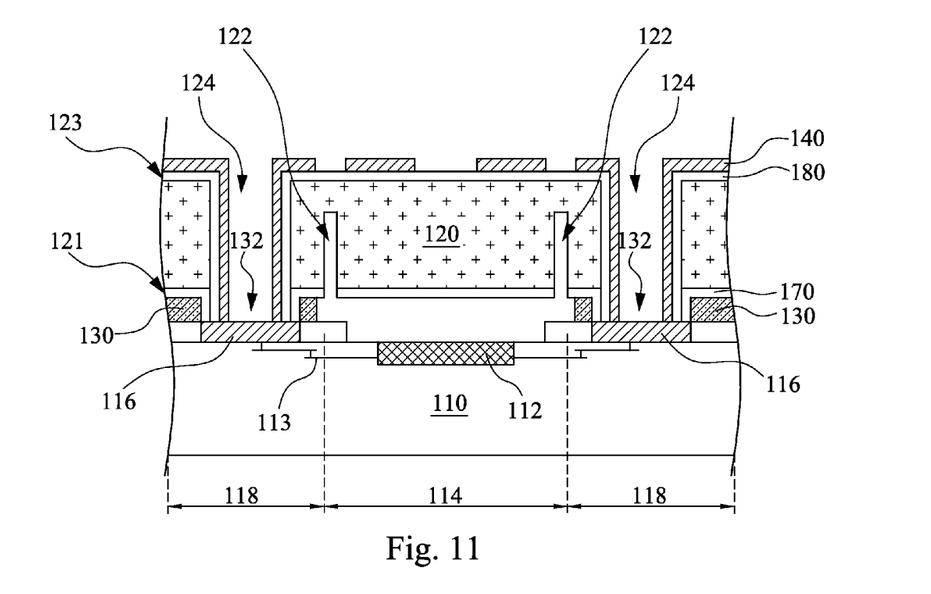
FIG. 11 is a cross-sectional view of a step after FIG. 10 in a process of fabricating a chip package in accordance with an embodiment of the instant disclosure.
Figure 12:
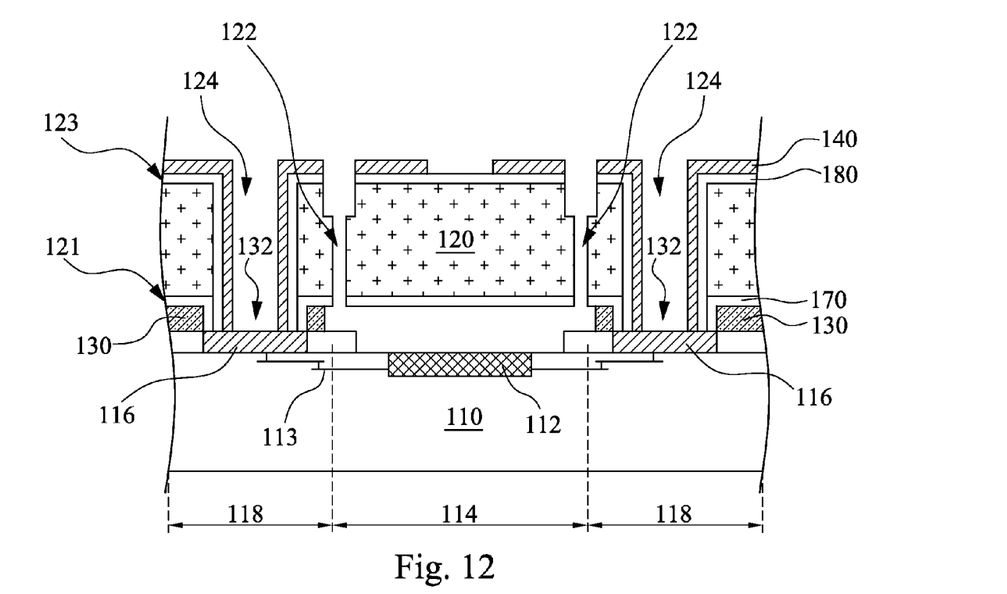
FIG. 12 is a cross-sectional view of a step after FIG. 11 in a process of fabricating a chip package in accordance with an embodiment of the instant disclosure.

FIG. 11 is a cross-sectional view of a step after FIG. 10 in the process of fabricating the chip package in accordance with an embodiment of the instant disclosure. FIG. 12 is a cross-sectional view of a step after FIG. 11 in the process of fabricating the chip package in accordance with an embodiment of the instant disclosure. Please refer to FIG. 11. The redistribution layer 140 is disposed on the second insulation layer 180 and inside the via 124 so as to electrically connect to the conductive pad 116. The material of the redistribution layer 140 may be, for example, aluminium, copper or nickel or any other suitable materials and is disposed on the second insulation layer 180 by suitable deposition process. The redistribution layer 140 undergoes photolithography to create a predetermined pattern over the second insulation layer 180. Next, please refer to FIG. 12. the interposer 120 is etched to expose the trench 122 on the upper surface 123. The trench 122 then goes through the entire interposer 120 such that the sensing unit 112 of the semiconductor chip 110 that is underneath the interposer 120 can be exposed. The external audio wave, pressure, temperature or changes can then be detected.

Figure 13:
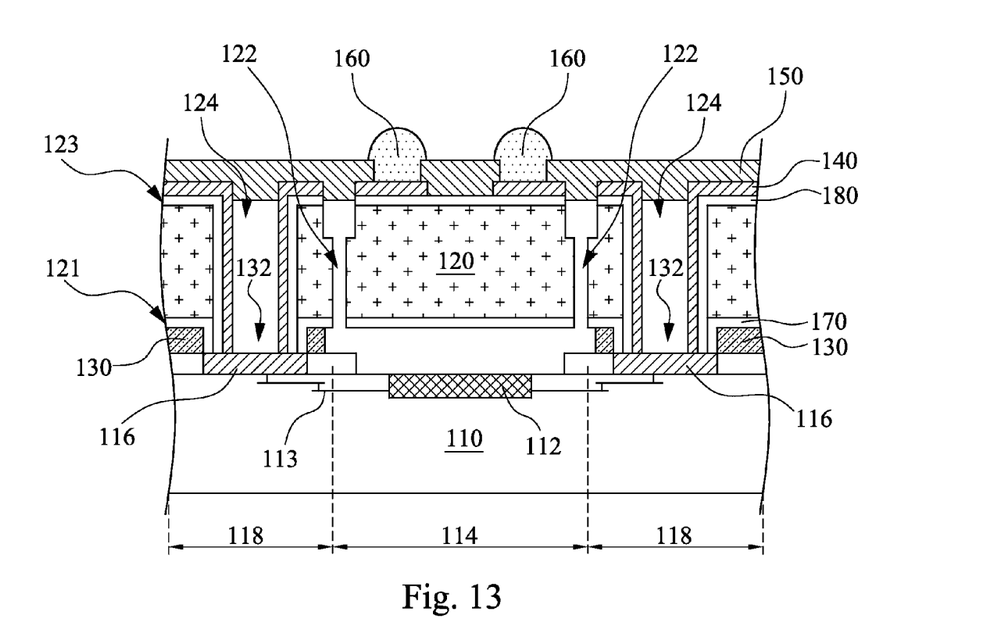
FIG. 13 is a cross-sectional view of a step after FIG. 12 in a process of fabricating a chip package in accordance with an embodiment of the instant disclosure.

FIG. 13 is a cross-sectional view of a step after FIG. 12 in the process of fabricating the chip package in accordance with an embodiment of the instant disclosure. Please refer to FIG. 13. The packaging layer 150 is formed and covers the redistribution layer 140. The formation of the packaging layer 150 over the redistribution layer 140 includes spreading the packaging layer 150 over the redistribution layer 140. In some embodiments of the instant disclosure, in the step of spreading the packaging layer 150 over the redistribution layer, the packaging layer 150 fills a portion of the via 124. As a result, the contact area between the packaging layer 150 and the redistribution layer 140 over the wall 125 of the via 124 is relatively smaller, and a pressure between the packaging layer 150 and the redistribution layer 140 over the wall 125 of the via 124 can be reduced. The expansion or creases of the packaging layer 150 will have less effect to the redistribution layer 140, and wire breakage in redistribution layer 140 is less likely to occur. The overall durability of the chip package 100 is therefore greatly enhanced. FIG. 2 is a cross-sectional view of a step after FIG. 13 in the process of fabricating the chip package in accordance with an embodiment of the instant disclosure. As shown in FIG. 2, the packaging layer 150 is formed with a second opening 152 to expose the trench 122. In some embodiments of the instant disclosure, the formation of the packaging layer 150 to cover the redistribution layer 140 includes spreading the packaging layer 150 over the redistribution layer 140, and second opening 152 is formed by laser drilling the packaging layer 150 to expose the trench 122. As shown in FIG. 2, in some embodiments of the instant disclosure, soldering ball 160 is formed on the interposer 120. The soldering ball 160 is electrically connected to the redistribution layer 140. The material of the soldering ball 160 may be tin or any other suitable metal or metal alloy for soldering. The soldering ball 160 acts as a bridge between the chip package 100 and the external printed circuit board or other interposers. The signal generated by the sensing unit 112 from a detection event can control the input/output signal of the printed circuit board or other interposers through the soldering ball 160, redistribution layer 140 and the conductive pad 116 that is electrically connected to the sensing unit 112. The input/output signal from the printed circuit board or the other interposers can control the sensing unit 112 through the soldering ball 160, redistribution layer 140 and the conductive pad 116 that is electrically connected to the sensing unit 112. The chip package 100 is then complete as shown in FIG. 2.

In summary, the polymer supporting adhesive layer of the instant disclosure can replace the soldering bumps that undergoes eutectic bonding, and therefore the contact area between the semiconductor chip and the interposer may have larger process margin. In this regard, the connection between the semiconductor chip and the interposer is firmly secured. In addition, the polymer supporting adhesive layer can be formed under lower processing temperature, and the components in the semiconductor chip are less likely to be affected by high temperature. Furthermore, the polymer supporting adhesive layer has lower production cost and is therefore more suitable for mass production.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A method of manufacturing a chip package, comprising:
   forming at least a bump on a lower surface of an interposer;
   forming a first insulation layer to cover the lower surface and the bump;
   forming at least a trench extending from the lower surface towards an upper surface of the interposer;
   forming a polymer supporting adhesive layer surrounding the bump;
   coupling the interposer and a semiconductor chip by the polymer supporting adhesive layer, the semiconductor chip having at least a sensing component and a conductive pad electrically connected to the sensing component, wherein the bump is connected to the conductive pad;
   forming a via extending from the upper surface towards the lower surface, the via going through the bump to expose the conductive pad, wherein a width of the via is smaller than a width of the bump;
   forming a second insulation layer covering the upper surface and a wall of the via;
   forming a redistribution layer on the second insulation layer and in the via to electrically connect to the conductive pad;
   etching the interposer to expose the upper surface; and
   forming a packaging layer covering the redistribution layer, the packaging layer having a second opening to expose the trench.

2. The method of manufacturing the chip package of claim 1, wherein the via is formed by laser drilling.

3. The method of manufacturing the chip package of claim 1, wherein the width of the via is substantially the same as the width of the bump.

4. The method of manufacturing the chip package of claim 1, wherein forming the polymer supporting adhesive layer surrounding the bump further comprises:
   coating the polymer supporting adhesive layer on the lower surface; and
   photolithography etching the polymer supporting adhesive layer to expose the bump.

5. The method of manufacturing the chip package of claim 1, wherein in between coupling the interposer and a semiconductor chip by the polymer supporting adhesive layer and forming the via further comprises:
   thinning the interposer from the upper surface towards the lower surface.

6. The method of manufacturing the chip package of claim 1, wherein forming the packaging layer covering the redistribution layer further comprises:
   coating the packaging layer on the upper surface and the redistribution layer; and
   laser drilling the packaging layer to form the opening and expose the trench through the opening.

7. The method of manufacturing the chip package of claim 6, wherein in coating the packaging layer on the redistribution layer, the packaging layer fills a portion of the via.

8. The method of manufacturing the chip package of claim 1, wherein the polymer supporting adhesive layer comprises a thermal cured material, a UV light cured material or a combination thereof.

9. The method of manufacturing the chip package of claim 8, wherein the thermal cured material includes epoxy.

10. The method of manufacturing the chip package of claim 1, further comprising:
   forming a soldering ball on the interposer, the soldering ball electrically connected to the redistribution layer.

11. The method of manufacturing the chip package of claim 1, wherein the polymer supporting adhesive layer is a polymer dam.

12. A chip package, comprising:
   a semiconductor chip having at least a sensing unit disposed in an active area and at least a conductive pad electrically connected to the sensing unit;
   an interposer disposed on the semiconductor chip, the interposer having at least a trench and at least a via, wherein the trench goes through the interposer, and the via exposes the conductive pad;
   a polymer supporting adhesive layer sandwiched in between the semiconductor chip and the interposer, the polymer supporting adhesive layer formed with a first opening connecting to the via to expose the conductive pad;
   a first insulation layer disposed on a lower surface of the interposer and a portion of the first insulation layer disposed in the first opening to cover the polymer supporting adhesive layer;
   a redistribution layer disposed on the interposer and in the via to electrically connect to the conductive pad; and
   a packaging layer covering the interposer and the redistribution layer, the packaging layer formed with a second opening to expose the trench.

13. The chip package of claim 12, wherein the polymer supporting adhesive layer includes a thermal cured material, a UV light cured material or a combination thereof.

14. The chip package of claim 13, wherein the thermal cured material includes epoxy.

15. The chip package of claim 12, wherein the sensing unit is disposed in an active area of the semiconductor chip, the conductive chip is disposed in a peripheral area of the semiconductor chip, and the peripheral area surrounds the active area.

16. The chip package of claim 15, wherein a projection of the trench over the semiconductor chip is positioned over at least one side of the active area.

17. The chip package of claim 12, wherein the packaging layer fills a portion of the via.

18. The chip package of claim 12, further comprising a soldering ball disposed on the interposer, the soldering ball being electrically connected to the redistribution layer.

19. The chip package of claim 12, further comprising a soldering wire electrically connected to the redistribution layer.

20. The chip package of claim 12, further comprising a second insulation layer disposed on an upper surface of the interposer and a wall of the via.

21. The chip package of claim 20, wherein the first insulation layer and the second insulation layer include silicon oxide, silicon nitride, silicon oxynitride or a combination thereof.

22. The chip package of claim 12, wherein the polymer supporting adhesive layer is a polymer dam.

* * * * *